United States Patent
Leisher et al.

(10) Patent No.: US 9,331,455 B1
(45) Date of Patent: May 3, 2016

(54) FREQUENCY LOCKED DIODE LASER DEVICES EXHIBITING LOW POWER PENALTY

(75) Inventors: Paul Leisher, Terre Haute, IN (US); Steve Patterson, Vail, AZ (US)

(73) Assignee: nLIGHT Photonics Corporation, Vancouver, WA (US)

( * ) Notice: Subject to any disclaimer, the term of this patent is extended or adjusted under 35 U.S.C. 154(b) by 0 days.

(21) Appl. No.: 13/355,677

(22) Filed: Jan. 23, 2012

(51) Int. Cl.
*H01S 5/14* (2006.01)
*H01S 3/08* (2006.01)
*H01S 3/1055* (2006.01)
*H01S 3/10* (2006.01)
*H01S 3/00* (2006.01)
*H01S 5/00* (2006.01)
*H01S 5/10* (2006.01)

(52) U.S. Cl.
CPC ............ *H01S 5/141* (2013.01); *H01S 3/08009* (2013.01); *H01S 3/005* (2013.01); *H01S 3/10023* (2013.01); *H01S 3/1055* (2013.01); *H01S 5/005* (2013.01); *H01S 5/10* (2013.01); *H01S 5/14* (2013.01)

(58) Field of Classification Search
CPC ........... H01S 3/005; H01S 5/005; H01S 5/10; H01S 5/14; H01S 3/08009; H01S 3/1055; H01S 5/141
USPC .......................................................... 372/32
See application file for complete search history.

(56) References Cited

U.S. PATENT DOCUMENTS

| | | | | |
|---|---|---|---|---|
| 5,379,310 A * | 1/1995 | Papen et al. | ...................... | 372/23 |
| 5,555,253 A * | 9/1996 | Dixon | ........................ | 372/29.02 |
| 6,192,059 B1 * | 2/2001 | Karioja et al. | .................. | 372/20 |
| 6,205,159 B1 * | 3/2001 | Sesko et al. | ...................... | 372/20 |
| 7,298,771 B2 | 11/2007 | Volodin et al. | | |
| 7,545,844 B2 | 6/2009 | Volodin et al. | | |
| 7,796,673 B2 | 9/2010 | Volodin et al. | | |
| 2002/0181537 A1 * | 12/2002 | Mueller | ........................ | 372/102 |
| 2003/0058900 A1 * | 3/2003 | Woodley et al. | ................ | 372/20 |
| 2006/0251134 A1 * | 11/2006 | Volodin et al. | .................. | 372/22 |

OTHER PUBLICATIONS

Paul Leisher, Kirk Price, Scott Karlsen, David Balsley, Doug Newman, Rob Martinsen, and Steve Patterson, "High-Performance Wavelength-Locked Diode Lasers", SPIE Photonics West 2009, vol. 7198-38 (2009), Feb. 23, 2009.

Stefan Heinemann, Ben Lewis, Boris Regaard, and Torsten Schmidt, "Single Emitter Based Diode Lasers with High Brightness, High Power and Narrow Linewidth", Fraunhofer USA, Center for Laser Technology, 2011, Plymouth, MI, available online at: http://www.clt.fraunhofer.com/Publications/2011/Single%20Emiiter%20-Diodes%20-with%20High%20Brightness%20and%20-Narrow%20Linewidth.pdf.

(Continued)

*Primary Examiner* — Xinning Niu
(74) *Attorney, Agent, or Firm* — Klarquist Sparkman, LLP

(57) ABSTRACT

A laser diode apparatus including a diode laser, optics efficiently collimate the diode laser beam, and a narrow band reflector to provide optical feedback for wavelength stabilization of the diode laser in an extended cavity configuration. The extended cavity laser diode assembly has a low reflectivity coating applied to the front facet, and a narrow-band reflectivity engineered to optimize the output power from the diode laser, leading to power penalty-free operation of the extended cavity laser diode assembly as compared to a free-running diode laser. The extended cavity laser diode assembly can equally applied to a plurality of laser diodes, with either a single or a plurality of optical feedback devices forming the extended cavity configuration.

23 Claims, 6 Drawing Sheets

(56) References Cited

OTHER PUBLICATIONS

Stefan Heinemann, "Diode Lasers for Pumping Solid State lasers—State-of-the-Art and New Developments", Fraunhofer USA, Center for Laser Technology, 2009, Plymouth, MI, available online at: http://www.clt.fraunhofer.com/Publications/2009/Diode%20Lasers%2-for%20Pumping%20Solid%20State%20Lasers%20-%20State-of-the-Art%20and%20New%20Developments.pdf.

Mark L. Osowski, Yossi Gewirtz, Robert M. Lammert, Se W. Oh, Chameli Panja, Victor C. Elarde, Laurent Vaissie, Falgun D. Patel, and Jeffrey E. Ungar, "High-power semiconductor lasers at eye-safe wavelengths", QPC Lasers, Inc., 2009, Sylmar, CA, available online at: http://www.qpclasers.com/pdf/2009_4-13_DSS.pdf.

* cited by examiner

FREQUENCY LOCKED DIODE LASER DEVICES EXHIBITING LOW POWER PENALTY

STATEMENT REGARDING FEDERAL FUNDING

This invention was made with government support under contract no. FA9451-08-D-0218-0002 awarded by the U.S. Department of Defense. The government has certain rights in the invention.

BACKGROUND OF THE INVENTION

1. Field of the Invention

Generally, the field of the present invention relates to wavelength stabilized laser diodes and laser diode modules.

2. Background

Lasers have enjoyed wide usage in different industries for years. Diode lasers in particular offer high electrical to optical efficiency, high output power, and reliable performance. For example, compact modules may be constructed that house a plurality of semiconductor diode lasers, either in the form of a bar of such diode lasers or singly and separate from each other. Laser light emitted from the diode lasers can then be fiber-coupled using miniature optics and the fiber-coupled light can in turn be used for various applications, such as directly pumping larger solid-state lasers or high power fiber amplifiers. However, the lasing wavelength and spectral width are current and temperature dependent, and are often too broad for the narrow absorption line of certain materials. The use of diode lasers to pump these materials requires methods to narrow the spectral linewidth of the device, and lock the output wavelength to a predetermined value.

Many methods of optical feedback have been developed to narrow and lock the lasing spectrum of laser diodes. By including frequency selective feedback techniques and suppressing the Fabry-Perot modes of the cleaved laser facets, the diode can be forced to laser at a designed wavelength, as opposed to lasing at the peak of the gain bandwidth on one of the closely spaced Fabry-Perot modes. These frequency selective feedback techniques can be fabricated or incorporated either inside the cavity, as is the case for distributed Bragg reflector (DBR) or distributed feedback (DFB) lasers, or external to the cavity, as is the case for external cavity lasers (ECLS) fabricated in a Littrow, Littman, volume Bragg gratings, or fiber Bragg gratings. In each of these cases, optical feedback is used to lock and narrow the spectrum of laser diodes.

Ideally, wavelength stabilized devices would have the same power and efficiency characteristics as unlocked devices, and would be able to operate over a wide temperature range. Unfortunately, the feedback mechanisms used in stabilize diode laser wavelength introduce optical loss, reducing the output power and operating efficiency of the device. Additionally, variations in the device temperature can cause a broadening and shift of the peak of the optical gain in the semiconductor device, causing the device to lase on the parasitic Fabry-Perot modes, as opposed to the design wavelength. Despite the need by industry of an external wavelength locking semiconductor diode laser apparatus that may operate substantially power penalty-free, no such device has been created.

SUMMARY OF THE INVENTION

The present invention provides an innovation that satisfies the aforementioned need and allows extended cavity locked high power laser diode apparatuses to exhibit a low power penalty. Thus, according to one aspect of the present invention, a laser apparatus includes a semiconductor diode laser optically coupled to a wavelength selective feedback component and thereby forming an extended cavity laser, the extended cavity laser having less than a 2% reduction in slope efficiency over the diode laser without unlocked devices, the low power penalty being achieved by collimating lenses in fast and slow axes providing low-loss optical feedback directly to diode laser gain region, optimizing the anti-reflection coated exit facet of the diode laser to substantially reduce the mirror loss of the Fabry-Perot modes in the diode laser cavity so as to effectively increase the laser threshold for these FP modes, providing anti-reflective coated optics in the optical path with substantially reduced broad-band optical reflectivity so as to eliminate the possibility of parasitic Fabry-Perot modes in the extended laser cavity, ensuring that the optical feedback is efficiently coupled back into the laser cavity, and optimizing the reflectivity of the frequency selective optical feedback component for output power and efficiency of the extended cavity laser.

The foregoing and other objects, features, and advantages will become more apparent from the following detailed description, which proceeds with reference to the accompanying figures.

DETAILED DESCRIPTION OF THE INVENTION

Figure 1:
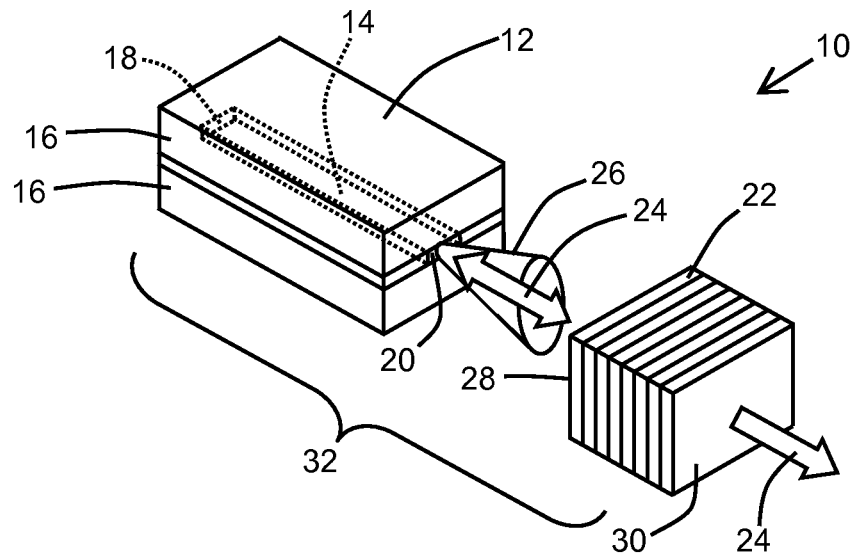
FIG. 1 is a perspective view of one embodiment of an extended cavity frequency-locked diode laser apparatus according to an aspect of the present invention.

Referring to FIG. 1, a schematic is shown of one embodiment of an extended cavity wavelength-locked semiconductor diode laser apparatus 10 of the present invention. The laser apparatus 10 includes a semiconductor laser diode 12 that has an internal Fabry-Perot optical resonator region 14 interposed between semiconductor layers 16 and bound at opposite ends by first and second facets 18, 20. With the resonator region 14 doped with laser dopants and the facets 18, 20 configured with particular reflectivities, laser operation can be enabled therein. Typically first facet 18 is operative as a high reflector, reflecting a maximum amount of light back into the resonant region 14 for further amplification. The second facet 20 is typically an exit facet operating as an output coupler to allow some light loss from the optical cavity for subsequent modification or use in various applications.

Figure 12:
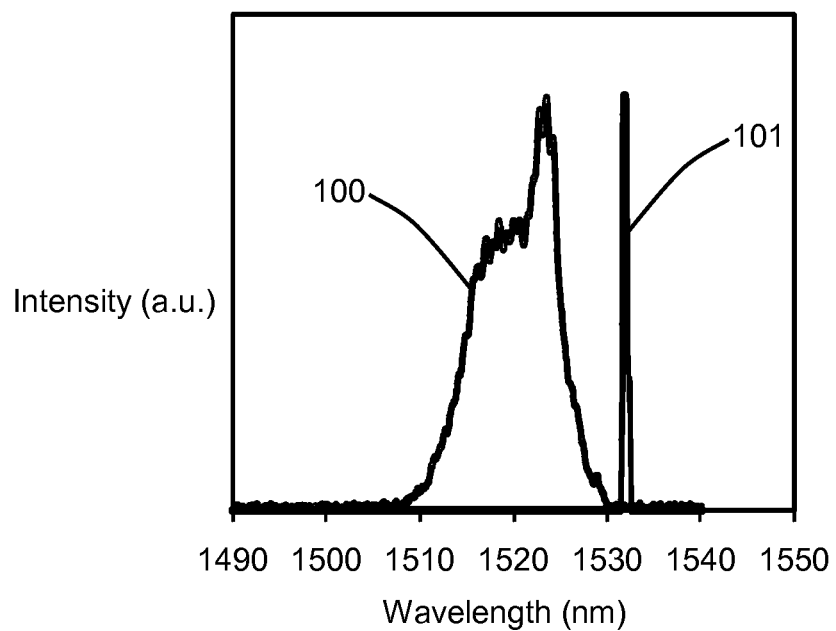
FIG. 12 is a chart showing a wavelength range of a locked and unlocked diode lasers.

A frequency selective optical feedback component 22 is disposed in the path 24 of or otherwise optically coupled to the beam of light 26 emitted from the exit facet 20. The frequency selective optical feedback component 22 is typically in the form of a narrow-band reflector that includes an input surface 28 and an output surface 30. Suitable narrow-band reflectors include, for example, volumetric Bragg or holographic gratings. The feedback component 22 is operative to selectively reflect a narrower frequency range back towards the semiconductor resonator cavity 14 so that the light resonating therein is similarly locked to the narrower frequency reflected by the component 22. By spacing apart the feedback component 22 from the exit facet 20 of the diode laser 12 and optically coupling the component 22 with the facet 20, an extended cavity 32 is formed that can provide laser operation based on cavity 32. As seen in FIG. 12, the use of feedback component 22 significantly narrows the range of wavelengths emitted from the laser cavity. Broader curve 100 shows a typical wavelength range provided by a diode laser operating without a frequency selective optical feedback component 22 whereas narrower curve 101 shows a curve of wavelength range provided by frequency selective optical feedback component 22.

Figure 2:
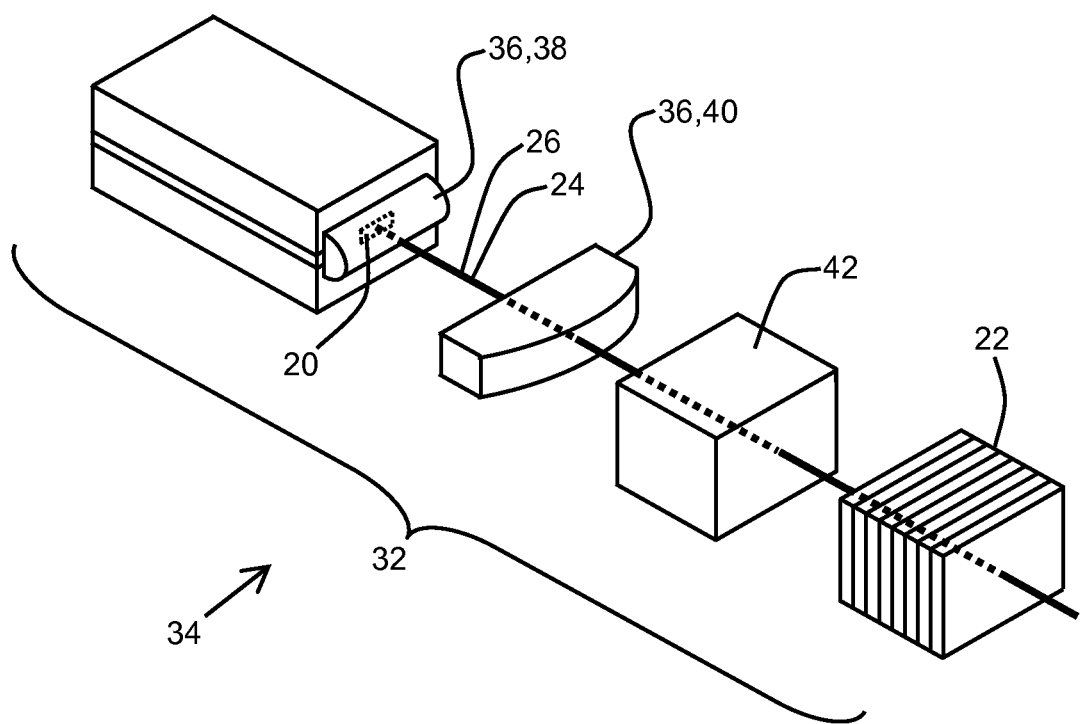
FIG. 2 is a perspective view of another embodiment of an extended cavity frequency-locked diode laser apparatus according to an aspect of the present invention.

Referring now to FIG. 2, another embodiment of an extended cavity frequency-locked diode laser apparatus 34 of the present invention is shown in perspective. Since the beam of light 26 emitted from exit facet 20 tends to diverge quickly, collimation optics 36 are disposed in the beam path 24 to redirect the beam along a straight path. A fast axis collimation optic 38 is usually disposed in the beam path 24 closer to the exit facet 20 due to the corresponding faster divergence rate. A slow axis collimation optic 40 is disposed further down the path 24 and receives and collimates the relatively slower diverging slow axis of the beam 26. Beam shaping optics 42 are disposed in the beam path 24 in intermediate relation to the collimation optics 36 and frequency selective optical feedback component 22. Many different possible implementations of beam shaping optics 42 may be used to manipulate beam 26 and beam path 24 for various output requirements. For example, step mirrors, beam twisting optics, and prisms may be used each of which in combination or alone being a non-exhaustive enumeration of such optical shaping configurations.

When using extended feedback, such as with component 22, to spectrally narrow and lock high power laser diodes, such as diode lasers 12, very high levels of optical feedback provided by, for example, grating reflectivity, VHG reflectivity, a fiber Bragg grating, etc., are used. The high levels of optical feedback thereby provided suppress undesired Fabry-Perot modes of the extended cavity, but have the unintended consequence of forming a laser cavity that reduces the output power and laser efficiency, leading to a power penalty typically greater than 5% and with a corresponding slope efficiency drop. This approach also leads to poor selectivity between the extended cavity and the Fabry-Perot modes thereof, leading to the unintended consequence of poor temperature locking range in addition to the aforementioned power and efficiency penalty.

In order to achieve wavelength stabilized laser diode performance that can operate with minimal power penalty over a broad temperature range, parasitic Fabry-Perot modes should be suppressed and the narrow-band feedback reflectivity of the extended cavity reflector in the extended cavity configuration should be matched to the optimal reflectivity of the laser diode operating in an internal cavity or free-standing configuration. The parasitic Fabry-Perot modes are effectively suppressed by making the threshold gain for the cavity defined by the narrow-band reflector substantially smaller than the threshold gain of the cavity defined by the Fabry-Perot modes of the diode laser. The laser gain equation used for different laser cavities can be defined as:

$$\gamma_{th} = \alpha_i + \frac{1}{2L} \ln\left(\frac{2}{R_{Back} R_{Front}}\right) = \alpha_i + \alpha_{mirror} \quad \text{(Eq 1)}$$

where $\gamma_{th}$ is the threshold gain, $\alpha_i$ is the intrinsic material loss, L is the laser cavity length, $R_{Back}$, and $R_{Front}$ are back and front mirror reflectivities, respectively, and $\alpha_{mirror}$ is the mirror loss. Typical optimal reflectivity values for a 1.5 mm cavity length diode are in the 5%-9% range, corresponding to a mirror loss of 10 and 8 cm$^{-1}$, respectively.

For an extended cavity configuration 32, the front facet reflectivity of the laser diode cavity 14 should be substantially reduced, leading to a very high mirror loss. For instance, reducing the facet reflectivity to <0.1% increases the mirror reflectivity loss, $\alpha_{mirror}$, of the laser diode cavity 14 to over 23 cm$^{-1}$. As the peak value of the optical gain bandwidth changes as a function of drive current and temperature, the reduction in front facet reflectivity is determined by balancing the desired operating temperature range while maintaining wavelength stabilization and by the physical limits on reduction of front facet reflectivity. Thus, optimizing the reflectivity of the feedback element 22 based on the principles described herein provides an extended cavity laser 32 suitable for various applications and with minimal power penalty compared to operation of the laser diode 12.

Figure 3:
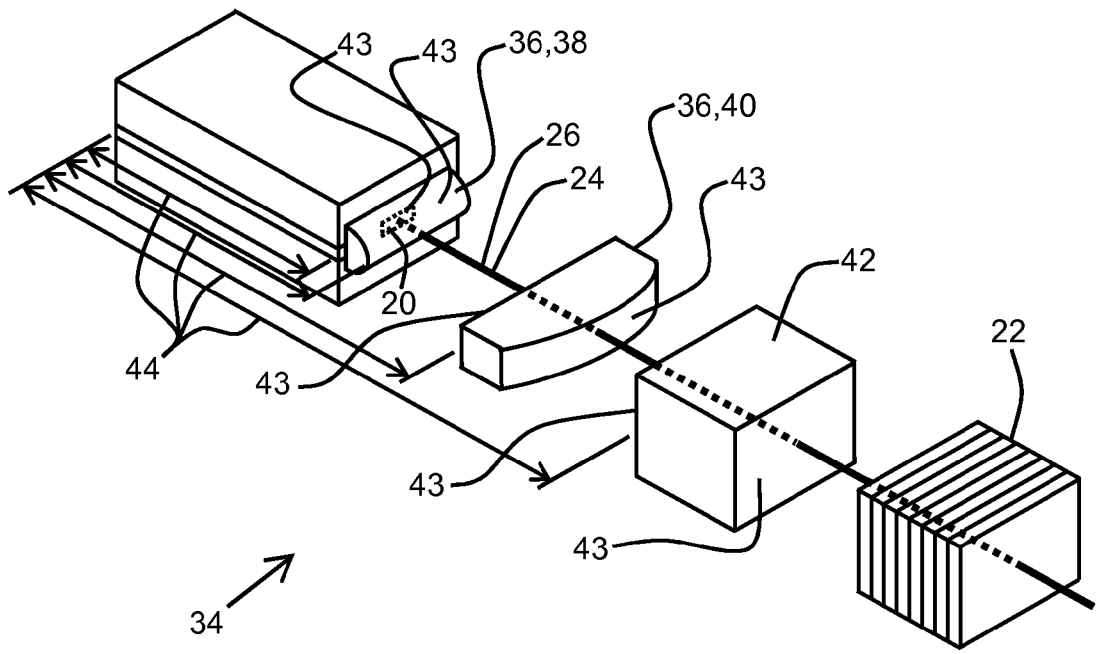
FIG. 3 is a perspective view of another embodiment of an extended cavity frequency-locked diode laser apparatus according to an aspect of the present invention.

Also, the broad-band optical feedback from other optics in the optical path 24 between the diode 12 and the narrow-band reflector 22 should be substantially reduced. For example, referring to another embodiment of an extended cavity frequency-locked diode laser apparatus 34 of FIG. 3, several examples of competing cavities 44 are shown that typically resonate Fabry-Perot modes and provide undesirable feedback. Additionally, the reflectivity of the narrow-band reflector 22 should be configured to match the mirror loss, $\alpha_{mirror}$, of the optimal mirror loss of the laser diode 12. Incorporating the principles described herein, the apparatus 34 as well as other embodiments within the scope of the present invention can be made to lase at the desired single wavelength determined by the extended cavity 32 with little to no power penalty, such as, for example, less than a 3% efficiency drop, and with lasing on competing Fabry-Perot modes substantially reduced. One effective way to incorporate the principles herein is the application of anti-reflective coating 43 at the exit facet 20 of the laser diode. Additional loss from broad-band reflections, such as parasitic Fabry-Perot modes resonated by competing cavities 44 and defined by optical components situated in the optical path, can be diminished with application of anti-reflective coating 43 to the surfaces of respective components, such as the fast and slow axis collimation optics 36 and beam-shaping optics 42, if present. Low reflectivity anti-reflective coating is particularly suited for coverage of bulk optics, such as collimation and beam shaping optics, because they are typically made from homogenous materials. The application of coatings 43 should reduce reflectivity values of optical surfaces to below 0.5% or otherwise as low as possible so as to provide better selectivity between desired feedback and broadband parasitic feedback.

The output power of a high power laser diode, such as diode 12, is largely determined by the differential slope efficiency thereof, that is, the efficiency of the laser diode in coupling generated photons out of the laser cavity:

$$\eta_d = \eta_i \frac{\alpha_{mirror}}{\alpha_{mirror} + \alpha_i} \quad \text{(Eq. 2)}$$

where $\eta_d$ is the differential slope efficiency, $\eta_i$ is the intrinsic efficiency, $\alpha_{mirror}$ is the mirror loss and $\alpha_i$ is the intrinsic loss. Conventional frequency-locked extended cavities use mirror reflectivity values for the internal diode cavity that are too high, resulting in mirror loss values that are very low, causing the ratio of mirror loss of the internal diode cavity to total loss of the frequency-locked extended cavity to be low, reducing the differential slope efficiency of the extended cavity, the output power, and the diode efficiency. By configuring the narrow-band feedback reflectivity to be the same as the optimized reflectivity of the diode laser without the frequency selective optical feedback component, the slope efficiency power penalty is minimized.

Figure 5:
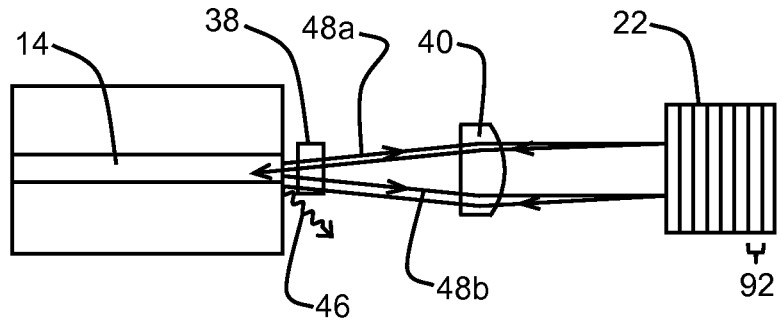
FIG. 5 is a top view of another embodiment of an extended cavity frequency-locked diode laser apparatus according to an aspect of the present invention.

The power penalty is further exacerbated by imperfect feedback into the laser diode cavity. For example, in the embodiment of an extended cavity frequency-locked diode laser apparatus as shown in FIG. 5, reflected light that is not coupled into the laser diode resonator 14 becomes a further source of loss 46. Example marginal rays 48a, 48b are emitted from diode resonator region 14 and are directed to respective fast and slow axis collimators 38, 40 before being reflected by frequency selective feedback element 22. The reflected marginal rays 48a, 48b propagate back towards diode cavity 14. However, due to misalignment and other imperfections in the optical feedback path, example marginal ray 48b fails to be properly coupled into the cavity 14 and becomes a source of loss 46. Also, conventionally, frequency locking elements 22, such as VBGs, have been incorporated into fast axis collimation lenses, or placed in the optical path of a diode that is collimated in the fast axis but not in the slow axis. Such configurations lead to additional optical scattering loss, further reducing the power and efficiency of the locked laser diode. By placing the feedback device 22 normal to the path of the collimated light so that light reflected thereby is directed back into the laser resonator 14, the optical loss 46 can be significantly reduced and lead to a reduction in power penalty for spectrally locked laser diodes or laser diode arrays.

Figure 4:
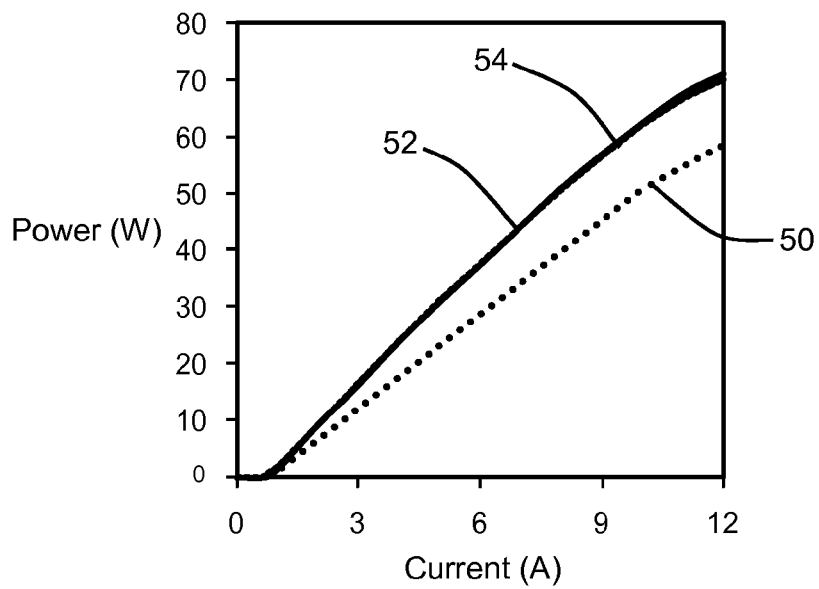
FIG. 4 is a chart depicting power penalty advantages according to an aspect of the present invention.

In FIG. 4 a typical power penalty curve 50 is shown for a conventional laser diode module locked with an extended cavity frequency locking element. The curve 50 can be compared against a typical power curve 52 for a corresponding unlocked module. The typical externally locked power curve experiences significant power reduction at higher currents and for normal operation. In the embodiments of the apparatus of the present invention, low to zero power penalties are achieved, as exhibited by typical power curve 54. The lack of penalty allows the curve 54 to closely match the curve 52 of an unlocked module, even at high power operation. While FIG. 4 shows relatively high power ranges, power ranges within the scope of the present invention may vary significantly. Powers at or above 0.5 W are typical for single or few diode laser apparatuses while lower or higher powers outputs are possible as well.

Figure 6:
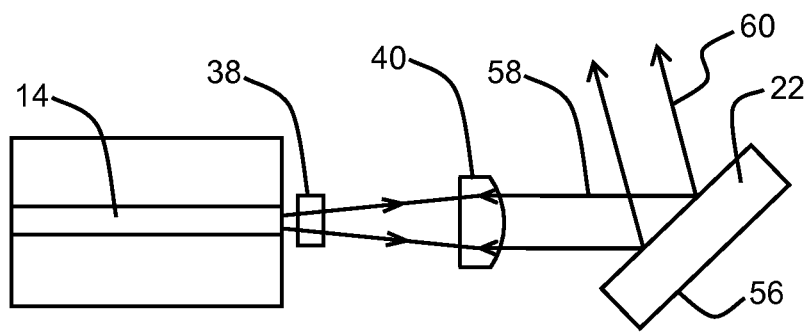
FIG. 6 is a top view of another embodiment of an extended cavity frequency-locked diode laser apparatus according to an aspect of the present invention.
Figure 7:
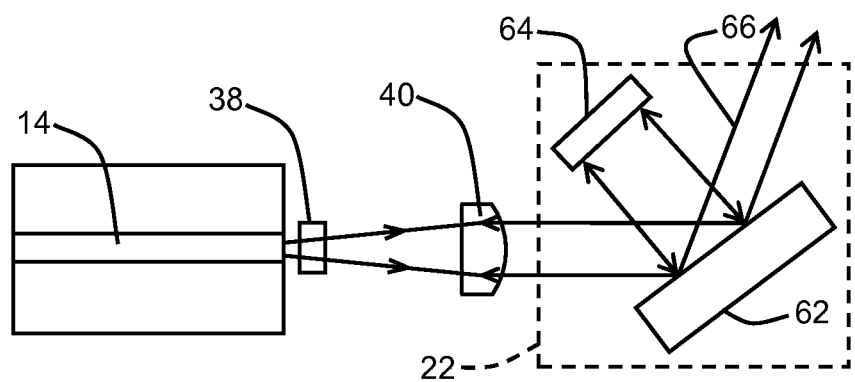
FIG. 7 is a top view of another embodiment of an extended cavity frequency-locked diode laser apparatus according to an aspect of the present invention.

A corresponding low to zero power penalty is achievable with single diode, diode bar, and other laser diode and laser diode module configurations utilizing one or more frequency selective optical feedback elements 22. Referring now to FIGS. 6 and 7, in the illustrated embodiments of the extended cavity frequency-locked diode laser apparatus, diode lasers 12 are shown with corresponding collimation optics 38, 40 and some frequency selective optical feedback elements 22 alternatives to volume Bragg gratings hereinbefore described. One alternative includes a Littrow-type configuration, shown in FIG. 6, which includes a diffraction grating 56 disposed in the optical path at a predetermined angle. The first-order diffracted beam 58 provides optical feedback via reflection back into cavity 14 while an output beam 60 is also diffracted by the grating 56 at a frequency tuned by the angle of the grating 56 in relation to the feedback path. In another example shown in FIG. 7, a Littman-Metcalf configuration is used which includes a diffraction grating 62 disposed at an angle in relation to the optical feedback path of the extended cavity laser and a mirror 64 disposed in relation to the grating 62 for reflecting diffracted light back towards the grating 62. An output beam 66 is provided by the combination of diffraction and reflection. Other configurations are possible as well, including the optical coupling of diode laser to a fiber Bragg grating, etc.

Figure 8:
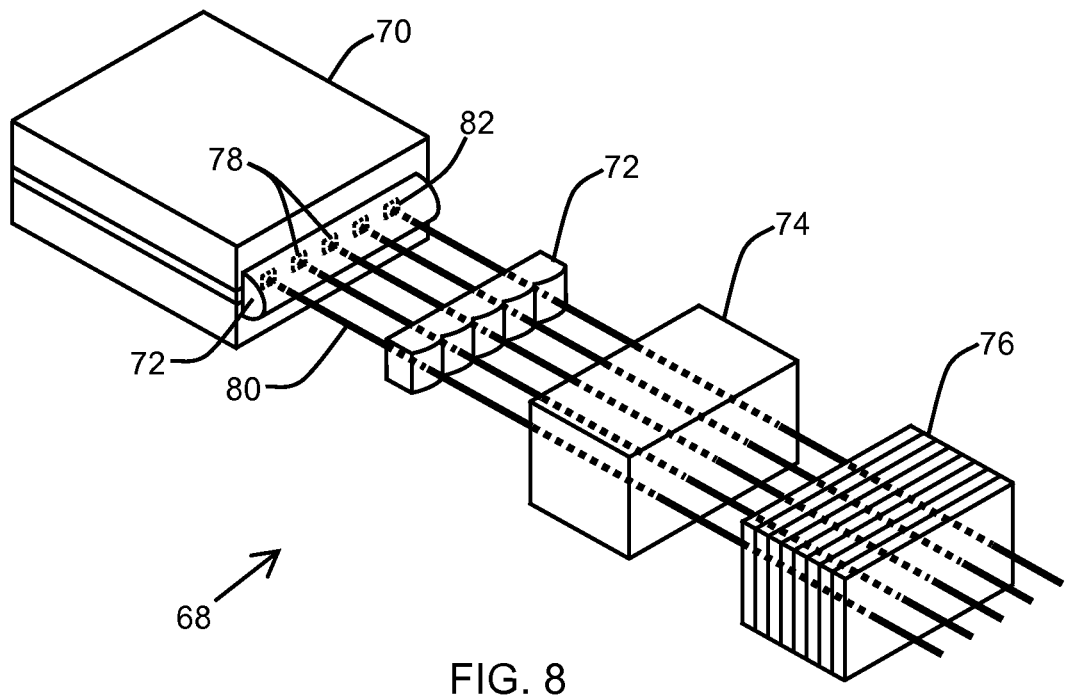
FIG. 8 is a perspective view of one embodiment of an extended cavity frequency-locked diode laser bar apparatus according to an aspect of the present invention.
Figure 9:
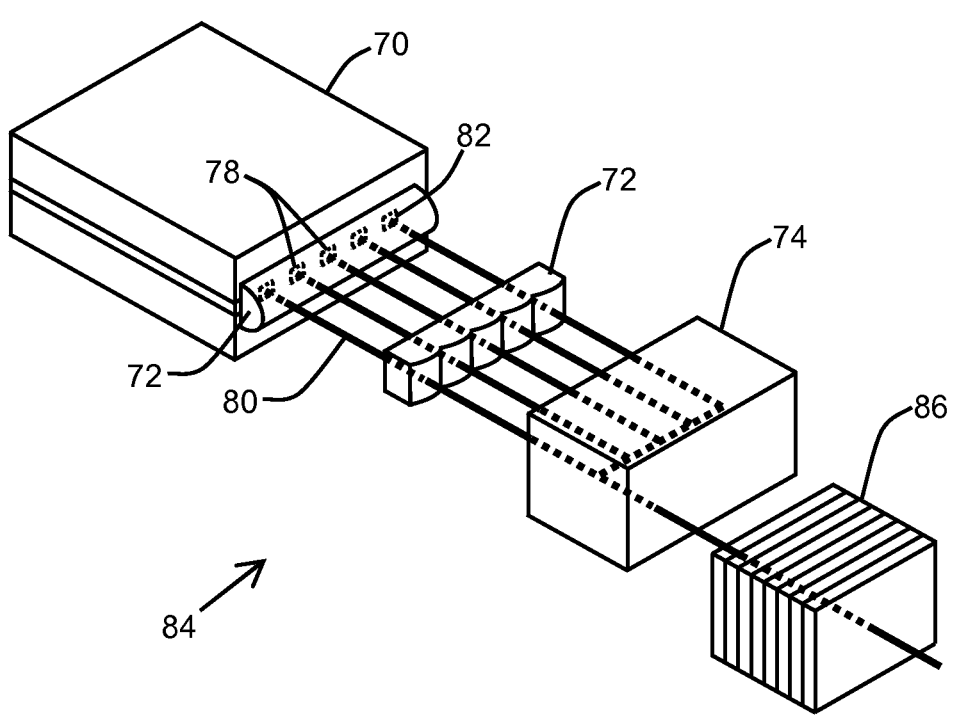
FIG. 9 is a perspective view of another embodiment of an extended cavity frequency-locked diode laser bar apparatus according to an aspect of the present invention.

Laser diode bar based embodiments of the apparatus in accordance with the present invention are shown in FIGS. 8 and 9. As shown in FIG. 8, a corresponding diode laser apparatus 68 includes one or more diode laser bars 70 in optical communication with collimation optics 72, beam shaping optics 74, one or more frequency selective optical feedback elements 76. Diode laser bars 70 typically include several diode laser emitters 78 formed so as to be laterally situated with respect to each other and arranged to emit laser beams 80 in a common parallel direction from the respective exit facets 82 of the emitters 78. Frequency-selective optical feedback component 76 can be a single unit or separate units configured to lock the same or different frequencies. As shown in FIG. 9, a diode laser apparatus 84 includes a diode laser bar 70 and collimation optics 72 and operates similarly to diode laser apparatus 68. However, apparatus 84 uses beam shaping optics 74 to combine beams 80 and direct the paths thereof to a single frequency selective optical feedback component 86 that locks each of the beam-directed diode emitters 78. It should be understood that a plurality of bars may be used instead of a single bar as shown in FIGS. 8 and 9. Similarly, in other aspects of the various figures herein, where a single object is shown, a plurality of objects may be used as well.

Figure 10:
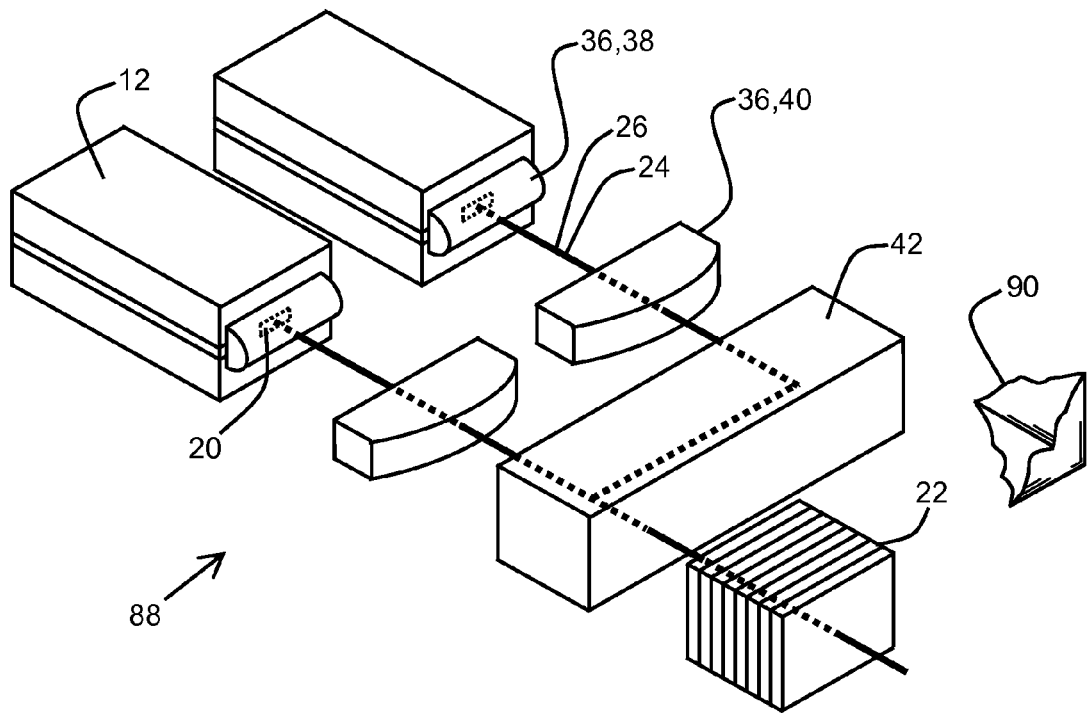
FIG. 10 is a perspective view of one embodiment of an extended cavity frequency-locked diode laser apparatus using a plurality of single-emitter diode lasers according to an aspect of the present invention.

Referring now to FIG. 10, in an another exemplary embodiment of the apparatus of the present invention an diode module apparatus 88 is shown that includes two diode lasers 12 disposed relative to each other in a module housing 90 and arranged to emit in a parallel direction. Housing 90 shown in cut-away may be made from different materials though heat conductive materials are well-suited to allow for effective heat dissipation during laser operation. In other embodiments more than two diode lasers 12 may be used. The diode lasers emit beams 26 along beam paths 24. The beams 26 are collimated with collimation optics 36 and directed to and through beam shaping optics 42. In some embodiments the beams 26 are stacked in the fast axis for subsequent application, such as coupling into an optical fiber or pumping a solid state block. In other embodiments the collimation optics 36 and beam shaping optics 42 share optical components. In still other embodiments the separate diode lasers are arranged to emit in a direction other than parallel. A frequency selective optical feedback component 22 receives the combined beams and partially reflects the beams 26 back to their respective diode lasers 12. In some embodiments a plurality of frequency selective optical feedback components 22 are optically coupled with respective diode lasers 12 instead of using only one frequency selective optical feedback component 22.

Figure 11:
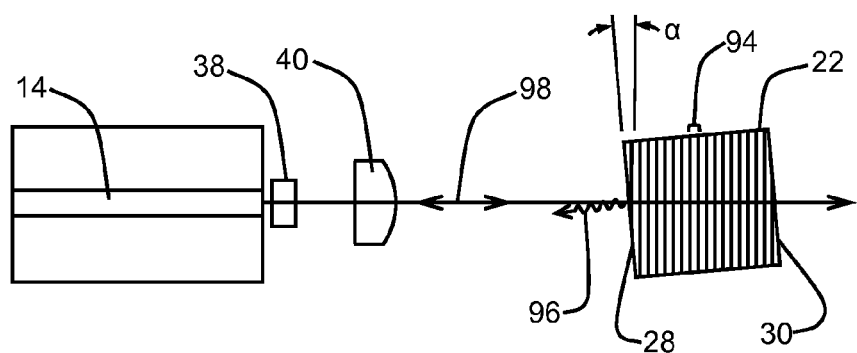
FIG. 11 is a top view of another embodiment of an extended cavity frequency-locked diode laser apparatus according to an aspect of the present invention.

As shown in FIG. 5, frequency selective optical feedback components 22 in the form of a volume Bragg gratings typically have a parallel periodic layering 92 of dielectric and periodic refractive index change associated therewith. In some embodiments of the apparatus of the present invention, such as the one shown in FIG. 11, the VBG is characterized by a periodic layering 94 that is at an angle α with respect to the reflective input and output surfaces 28, 30. By writing the input surface at an off-angle α, broadband optical feedback in the extended cavity laser can be further reduced. In this way, a designed misalignment allows feedback of undesirable frequencies to be scattered as loss beams 96 away from a return optical path 98 to the diode gain region 14.

It is thought that the present invention and many of the attendant advantages thereof will be understood from the foregoing description and it will be apparent that various changes may be made in the parts thereof without departing from the spirit and scope of the invention or sacrificing all of its material advantages, the forms hereinbefore described being merely exemplary embodiments thereof.

What is claimed is:

1. A laser apparatus comprising:
   at least one semiconductor diode laser including an exit facet having a facet reflectivity that is less than an exit facet reflectivity associated with a peak slope efficiency of the semiconductor diode laser operating in an unlocked configuration and capable of emitting a laser beam therefrom;
   collimation optics optically coupled to the exit facet and situated to collimate the laser beam emitted from the exit facet; and
   at least one frequency selective optical feedback component having an input surface optically coupled to said collimation optics and said exit facet so that the at least one diode laser and the frequency selective optical feedback component form an extended cavity laser, said at least one frequency selective optical feedback component having a reflectivity selected at or above the exit facet reflectivity associated with the peak slope efficiency of the unlocked semiconductor diode laser to narrow a lasing wavelength of said at least one semiconductor diode laser such that said extended cavity laser operates with approximately the same or greater slope efficiency compared to laser operation of the unlocked semiconductor diode laser and such that said extended cavity laser remains locked at the narrowed lasing wavelength over a selected temperature range associated with a difference between the exit facet and frequency selective optical feedback component reflectivities.

2. The laser apparatus of claim 1 wherein said exit facet is coated with an anti-reflection coating.

3. The laser apparatus of claim 1 wherein said at least one semiconductor diode laser has an output power of at least 0.5 Watts.

4. The laser apparatus of claim 1 wherein said collimation optics provide low optical loss by coupling light efficiently back into said at least one semiconductor diode laser.

5. The laser apparatus of claim 1 wherein broadband optical feedback in said extended cavity laser is reduced to assist with lasing at the narrowed lasing wavelength via reduction in optical reflectivity of surfaces internal to said extended cavity laser.

6. The laser apparatus of claim 5 wherein said reduction in optical reflectivity of surfaces internal to said extended cavity laser is achieved through application of anti-reflective coating to said surfaces.

7. The laser apparatus of claim 1 wherein broadband optical feedback in said extended cavity laser is reduced to ensure lasing at a selected wavelength by configuring said at least one frequency selective optical feedback component to have an off-axis grating.

8. The laser apparatus of claim 1 wherein said extended cavity laser is in a Littrow configuration.

9. The laser apparatus of claim 1 wherein said extended cavity laser is in a Littman configuration.

10. The laser apparatus of claim 1 wherein said extended cavity laser wherein said at least one frequency selective optical feedback component is a volume Bragg grating, volume holographic grating, or fiber Bragg grating.

11. The laser apparatus of claim 1 further comprising beam shaping optics disposed in relation to said at least one semiconductor diode laser and said at least one frequency selective optical feedback component, said beam shaping optics for directing beams therebetween.

12. The laser apparatus of claim 11 wherein said beam shaping optics combines the beam or beams emittable by said one or more semiconductor diode lasers to form a beam stack.

13. The laser apparatus of claim 1 further comprising a diode laser module housing.

14. The laser apparatus of claim 1 wherein said at least one semiconductor diode laser includes a plurality of diode laser emitters in the form of a laser bar.

15. The laser apparatus of claim 1 wherein said at least one semiconductor diode laser includes a plurality of diode laser emitters in the form of separate single-emitters.

16. The laser apparatus of claim 15 wherein said separate single-emitters are arranged to emit in a parallel direction.

17. A laser apparatus comprising:
   at least one semiconductor diode laser including an exit facet coated so as to have a facet reflectivity that is less than a reflectivity corresponding to a peak semiconductor diode laser slope efficiency and capable of emitting a laser beam therefrom;
   collimation optics disposed relative to said exit facet and optically coupled therewith, said collimation optics for receiving and collimating the laser beam emittable from said at least one semiconductor diode laser;
   at least one frequency selective optical feedback component having an input surface optically coupled to said collimation optics and said exit facet so as to form an extended cavity laser, said at least one frequency selective optical feedback component situated to couple light into and narrow the lasing wavelength of said at least one semiconductor diode laser such that said extended cavity laser, said at least one frequency selective optical feedback component having a reflectivity that is greater than the reflectivity corresponding to the peak semiconductor diode laser slope efficiency such that the slope efficiencies of the semiconductor diode laser and the external cavity laser are about the same over a selected current range and the external cavity laser remains wavelength locked over a temperature range in association with the difference between the exit facet and frequency selective optical feedback component reflectivities; and beam shaping optics disposed relative to said exit facet and said collimation optics, said beam shaping optics for directing the emittable beam or beams to said at least one frequency selective optical feedback component.

18. A method comprising:

selecting an exit facet reflectivity of a semiconductor diode laser to be less than an peak exit facet reflectivity corresponding to a peak unlocked slope efficiency of the semiconductor diode laser and a frequency selective optical feedback component reflectivity of a frequency selective optical feedback component situated to form an external cavity laser and to narrow the wavelength of the semiconductor diode laser to be greater than the peak exit facet reflectivity;

coating the exit facet of the semiconductor diode laser to the selected exit facet reflectivity;

optically coupling anti-reflection coated collimation optics to the exit facet of the semiconductor laser; and optically coupling the frequency selective optical feedback component to the semiconductor diode laser and the collimation optics so as to form the external cavity laser;

wherein a difference between the exit facet reflectivity and the frequency selective optical feedback component reflectivity is selected based on a temperature range over which the external cavity laser is narrowed to a selected wavelength and the slope efficiencies of the semiconductor diode laser and the external cavity laser are about the same over a selected current range associated with the temperature range.

19. The method of claim 18 wherein the at least one frequency selective optical feedback component is a volume Bragg grating.

20. An external cavity frequency-locked diode laser apparatus comprising:

at least one semiconductor diode laser situated to emit a laser beam from a front facet having a reflectivity lower than an optimal reflectivity of the front facet of the at least one semiconductor diode laser situated in a non-external cavity configuration; and a frequency selective optical feedback component situated to receive the laser beam from the at least one semiconductor diode laser and to reflect a portion of the laser beam back into the at least one semiconductor diode laser through the front facet thereof in order to narrow the wavelength of the laser beam and to form an external cavity, the frequency selective optical feedback component having a reflectivity defined in relation to an optimal reflectivity of the diode laser front facet of the at least one semiconductor diode laser situated in the non-external cavity configuration such that the laser beam output of the external cavity laser is substantially free of power penalty compared to operation of the semiconductor diode laser in the non-external cavity configuration and the wavelength of the semiconductor diode laser is narrowed over a temperature range associated with a difference between the front facet reflectivity and the frequency selective optical feedback component reflectivity.

21. The apparatus of claim 20, wherein the frequency selective optical feedback component is a volume Bragg grating.

22. A method, comprising:

determining an exit facet reflectivity for a semiconductor laser diode corresponding to a substantially maximum slope efficiency for internal cavity operation of the semiconductor laser diode over a selected current range;

applying a reflectivity coating to the exit facet that provides an exit facet reflectivity less than the determined exit facet reflectivity at a laser wavelength;

applying a reflectivity coating to a frequency selective optical feedback component that provides a corresponding reflectivity that is greater than the determined exit facet reflectivity at the laser wavelength; and aligning the semiconductor laser diode and the frequency selective optical feedback component to form an extended cavity semiconductor diode laser that has a wavelength narrowed within a temperature range corresponding to the difference between the exit facet and frequency selective optical feedback component reflectivities and a slope efficiency approximately the same as the slope efficiency of the internal cavity operation of the semiconductor diode laser.

23. The apparatus of claim 1, wherein the difference between the exit facet and frequency selective optical feedback component reflectivities is associated with a largest modal gain associated with the extended cavity over the selected temperature range.

* * * * *